(12) United States Patent
Bhat et al.

(10) Patent No.: US 7,635,623 B2
(45) Date of Patent: Dec. 22, 2009

(54) METHODS OF FORMING CAPACITORS

(75) Inventors: Vishwanath Bhat, Boise, ID (US); Noel Rocklein, Boise, ID (US); F. Daniel Gealy, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 423 days.

(21) Appl. No.: 11/488,587

(22) Filed: Jul. 17, 2006

(65) Prior Publication Data

US 2008/0014694 A1 Jan. 17, 2008

(51) Int. Cl.
*H01L 21/8242* (2006.01)
(52) U.S. Cl. .............. 438/240; 438/770; 257/E21.008
(58) Field of Classification Search .......... 438/240, 438/770, E21.008
See application file for complete search history.

(56) References Cited

U.S. PATENT DOCUMENTS

| 6,727,140 | B2 * | 4/2004 | Basceri et al. | ............ 438/240 |
| 7,033,884 | B2 * | 4/2006 | Basceri et al. | ............ 438/240 |
| 7,420,198 | B2 * | 9/2008 | Baek et al. | .................. 257/2 |
| 2002/0022334 | A1 * | 2/2002 | Yang et al. | ................ 438/396 |

* cited by examiner

*Primary Examiner*—Jerome Jackson, Jr.
*Assistant Examiner*—Paul A Budd
(74) *Attorney, Agent, or Firm*—Wells St. John P.S.

(57) ABSTRACT

A method of forming a capacitor includes forming a conductive first capacitor electrode material comprising TiN over a substrate. TiN of the TiN-comprising material is oxidized effective to form conductive $TiO_xN_y$ having resistivity no greater than 1 ohm·cm over the TiN-comprising material where x is greater than 0 and y is from 0 to 1.4. A capacitor dielectric is formed over the conductive $TiO_xN_y$. Conductive second capacitor electrode material is formed over the capacitor dielectric. Other aspects and implementations are contemplated, including capacitors independent of method of fabrication.

43 Claims, 7 Drawing Sheets

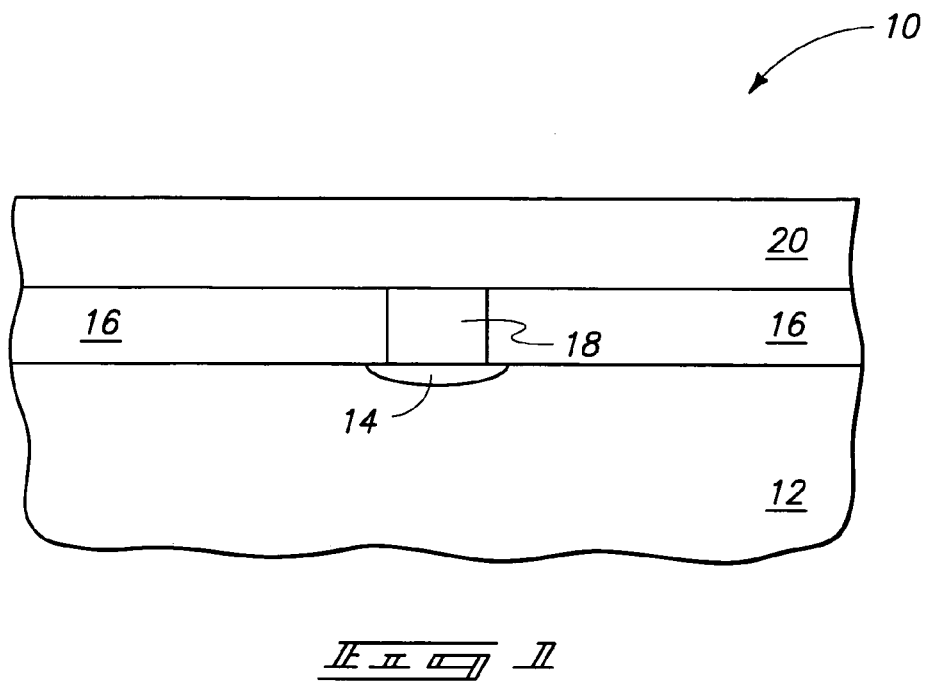
_Fig. 1_
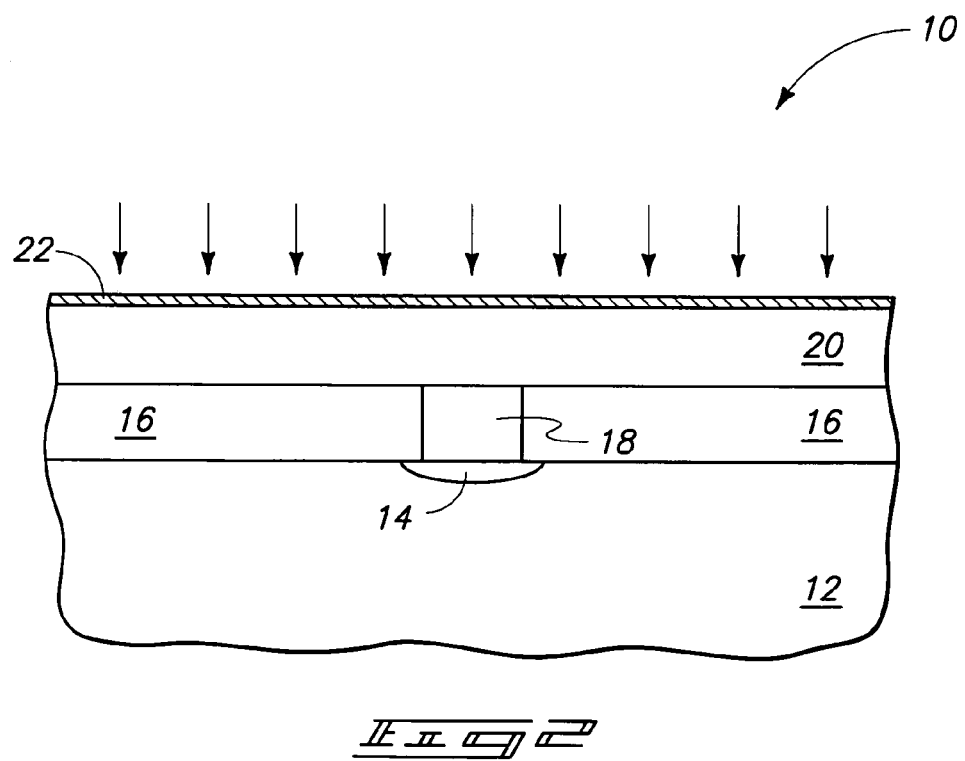
_Fig. 2_

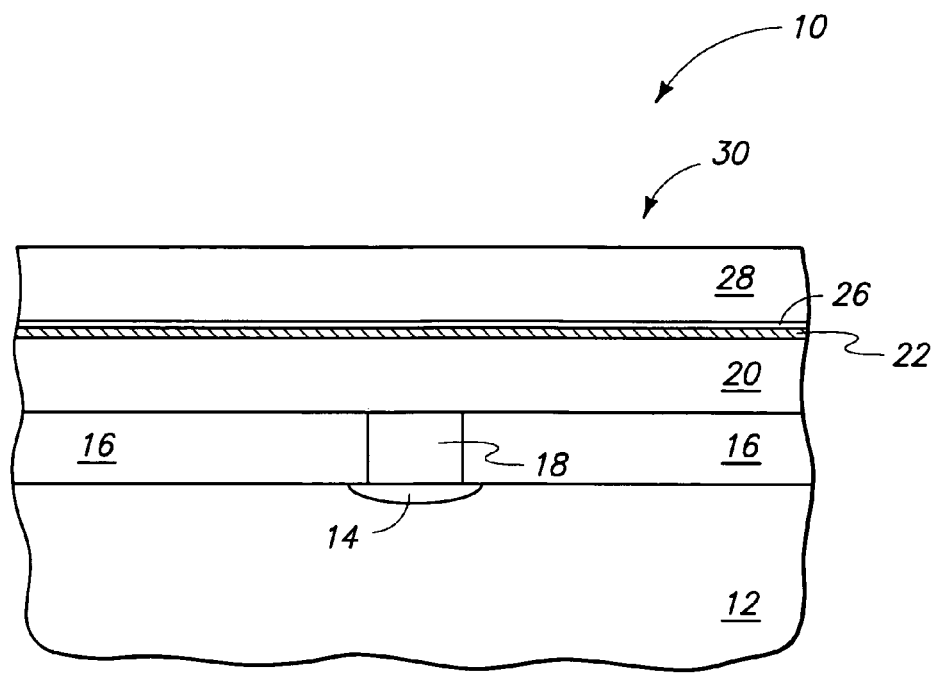
F I G. 3
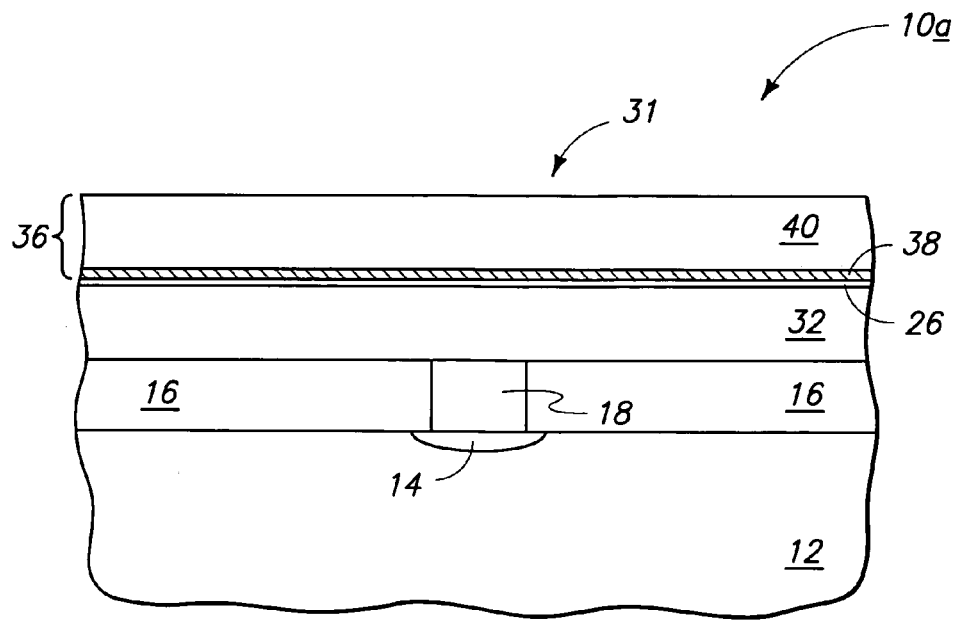
F I G. 4

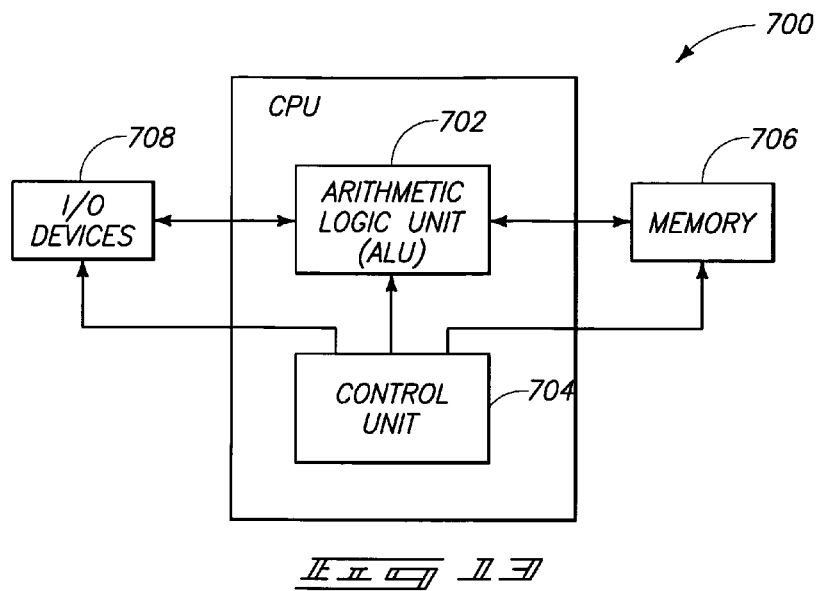
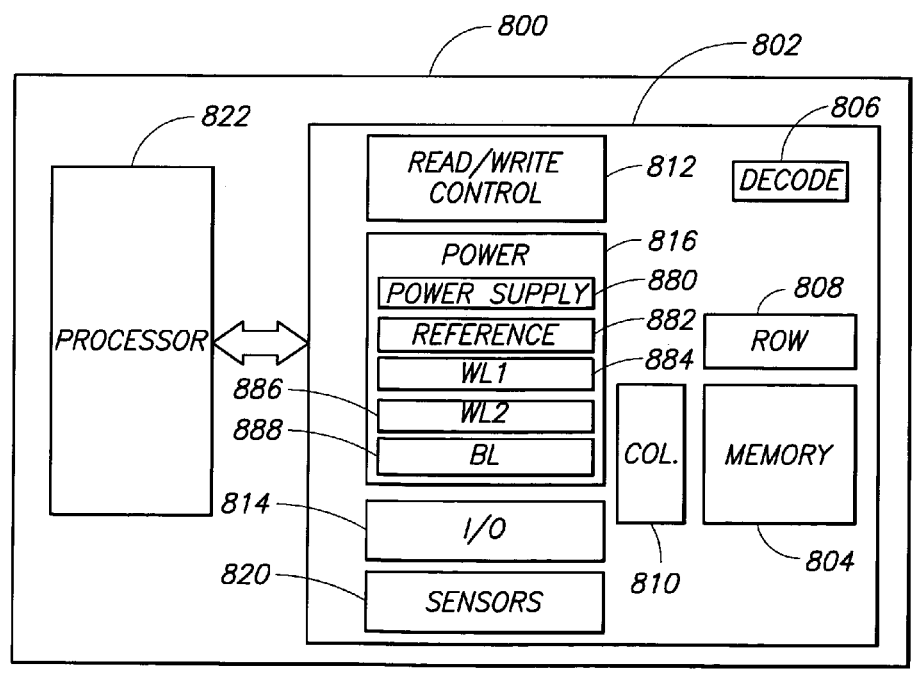

METHODS OF FORMING CAPACITORS

TECHNICAL FIELD

This invention relates to capacitors, and to methods of forming capacitors.

BACKGROUND OF THE INVENTION

Capacitors are one type of component commonly used in the fabrication of integrated circuits, for example in the fabrication of logic and memory circuitry. A typical capacitor includes two conductive electrodes separated by a non-conducting dielectric region. As integrated circuitry density has increased, there is a continuing challenge to maintain sufficiently high storage capacitance despite typical decreasing capacitor area. The increase in density of integrated circuitry has typically resulted in greater reduction in the horizontal dimension of capacitors as compared to the vertical dimension. In many instances, the vertical dimension of capacitors has increased.

A continuing goal in capacitor fabrication and integrated circuitry design is to achieve suitable high capacitance despite decreasing capacitor size. The degree of capacitance is impacted by a number of variables including capacitor size, capacitor shape/design, materials from which the capacitor is made, and thicknesses of the various capacitor layers. In many instances, there is a trade-off between parameters which tend to increase capacitance yet which can also undesirably impact undesired attributes of a capacitor. For example, certain parameters which tend to increase capacitance can undesirably also increase leakage of the capacitor electrodes through the capacitor dielectric between the electrodes and/or reduce the breakdown voltage at which the capacitor would fail.

While the invention was motivated in addressing the above identified issues, it is in no way so limited. The invention is only limited by the accompanying claims as literally worded, without interpretative or other limiting reference to the specification, and in accordance with the doctrine of equivalents.

BRIEF DESCRIPTION OF THE DRAWINGS

Preferred embodiments of the invention are described below with reference to the following accompanying drawings.

FIG. 1 is a diagrammatic cross sectional view of a semiconductor substrate fragment in process in accordance with an aspect of the invention.

FIG. 2 is a view of the FIG. 1 fragment at a processing step subsequent to that shown by FIG. 1.

FIG. 3 is a view of the FIG. 2 fragment at a processing step subsequent to that shown by FIG. 2.

FIG. 4 is a diagrammatic cross sectional view of an alternate embodiment semiconductor substrate fragment in process in accordance with an aspect of the invention.

FIG. 13 is a high-level block diagram of an electronic system according to an exemplary aspect of the present invention.

FIG. 14 is a simplified block diagram of an exemplary electronic system according to an aspect of the present invention.

DETAILED DESCRIPTION OF THE PREFERRED EMBODIMENTS

Figure 5:
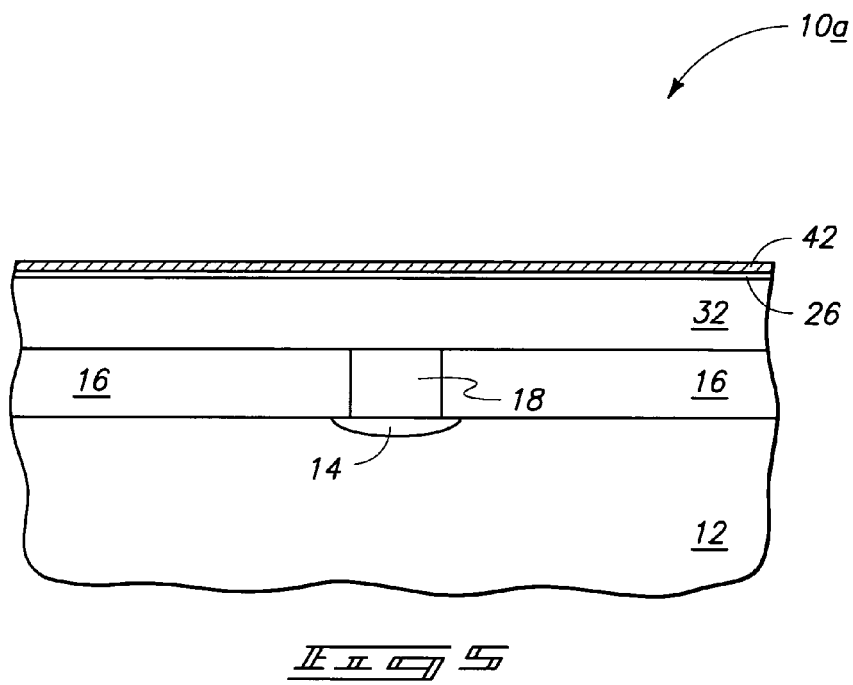
FIG. 5 is a diagrammatic cross sectional view of an alternate embodiment semiconductor substrate fragment in process in accordance with an aspect of the invention.

This disclosure of the invention is submitted in furtherance of the constitutional purposes of the U.S. Patent Laws "to promote the progress of science and useful arts" (Article 1, Section 8).

Aspects of the invention include methods of forming capacitors, and capacitors formed independent of the method of fabrication. Various exemplary implementations, and by way of example only, are described with reference to FIGS. 1-14. Exemplary first implementations of a capacitor and methods of forming a capacitor are initially described with reference to FIGS. 1-3. Referring to FIG. 1, a substrate fragment is indicated generally with reference numeral 10, and preferably comprises a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 is depicted as comprising a bulk monocrystalline substrate 12, for example monocrystalline silicon which is background or well-doped with a suitable conductivity enhancing impurity, or perhaps which is undoped. An exemplary conductive diffusion region 14 has been formed therein. A suitable interlevel dielectric layer 16 is provided over substrate material 12, with doped or undoped silicon dioxide being an example. A conductive plug 18 has been formed within dielectric layer 16 and electrically connects with diffusion region 14.

A conductive first capacitor electrode material 20 has been formed over substrate 12/14/16/18. An exemplary preferred thickness range for material 20 is from 50 Angstroms to 300 Angstroms. The discussion proceeds, by way of example only, with respect to the fabrication of a capacitor which is horizontally oriented for ease of depiction in the drawings. However, any capacitor construction is contemplated, for example whether vertical, finned, or otherwise, and whether such construction or constructions are existing or yet-to-be developed. Regardless, material 20 might be homogeneous or comprise multiple different composition layers, materials, or regions. In one exemplary preferred embodiment, capacitor electrode material 20 comprises, consists essentially of, or consists of TiN. Such can be deposited by any suitable chemical, physical, atomic, or other deposition method, and whether existing or yet-to-be developed. In one preferred embodiment, the first capacitor electrode material comprises at least one of TaN, HfN, or NbN, and also possibly in combination with TiN.

Referring to FIG. 2, TiN of the preferred embodiment TiN-comprising material 20 has been oxidized effective to form conductive $TiO_xN_y$ 22 having resistivity no greater than 1 ohm·cm over TiN-comprising material 20, where "x" is greater than 0 and "y" is from 0 to 1.4. By way of example only and for purposes of the continuing discussion, some or all of materials 22 and 20 can be considered as but one exemplary conductive inner capacitor electrode material formed or received over a substrate. Typically and preferably as depicted, such oxidizing forms a continuous layer 22, although such is not required nor might occur in all aspects of the invention. In the depicted exemplary preferred embodiment, $TiO_xN_y$ 22 is formed on TiN of TiN-comprising layer 20. In the context of this document, "on" and "upon" require at least some direct physical contacting relationship with the layer over which a material is stated to be received. The word "over" does not preclude intervening materials being received between two stated materials or layers in a manner whereby no direct physical touching/contact necessarily occurs. An exemplary preferred thickness for $TiO_xN_y$ 22 is from 5 Angstroms to 60 Angstroms, more preferably from 15 Angstroms to 30 Angstroms, with 30 Angstroms being a specific preferred example. With respect to $TiO_xN_y$ 22, "y" might be 0 or greater than 0. If 0, then "x" is ideally no greater than 1.98 such that the $TiO_x$ material has a conductivity defined by a resistivity no greater than 1 ohm·cm. If greater than 0, then "y" is preferably no greater than 1.3. Regardless, a preferred conductivity of $TiO_xN_y$ 22 is defined by a resistivity which is no greater than 0.5 ohm·cm.

Any suitable existing or yet-to-be developed oxidizing method(s) is contemplated whereby the $TiO_xN_y$ of the above stated conductivity is formed. Such oxidizing might be wet or dry, and regardless might preferably include exposure to $O_3$. In the context of this document, "wet" requires exposure to some $H_2O$ whether in such form as a feed material or as a reaction product of different feed materials to a substrate or chamber within which a substrate is received. Further, a combination of wet and dry oxidizing might occur. By way of example only, additional oxidizing gases include NO, $N_2O$ or $NO_2$. The oxidizing might include exposure to plasma, or be void of any plasma. If plasma is utilized, the oxidizing might occur within a chamber within which the plasma is formed, or remote from a chamber within which the plasma is formed. An exemplary preferred oxidation technique includes remote plasma $O_3$ exposure. For example and by way of example only, an exemplary oxidation includes using 16% by weight $O_3:O_2$ in a mix of $O_3$ and $O_2$, and which is subjected to remote plasma and then flowed to a chamber within which oxidation occurs. Exemplary flow rates are 300 sccm of such $O_3:O_2$ mix, and for example in combination with an inert gas flow, for example 500 sccm of Ar. Oxidation chamber pressure is preferably from 400 mTorr to 10 Torr. An exemplary preferred substrate temperature is from 250° C. to 500° C., with an exemplary exposure time being anywhere from 5 minutes to 100 minutes. A specific reduction-to-practice example was for 30 minutes at 300° C. and 450 mTorr.

Further by way of example only, a wet oxidation can occur whether consisting essentially of water or water in combination with another material, and whether liquid, vapor or some combination thereof. Exemplary preferred temperature and pressure for water vapor exposure are from 300° C. to 500° C. and from 200 mTorr to 100 Torr. Further by way of example only, the substrate might be exposed to a deionized water solution or, alternately for example, a deionized water solution within which $O_3$ is provided. Further, hydrogen peroxide and other solutions are contemplated, for example an SC1 solution comprising $H_2O_2$ and $NH_4OH$ or a piranha solution comprising $H_2SO_4$ and $H_2O_2$. Regardless, the oxidizing conditions and time of oxidizing are chosen and optimizable by the artisan to form the stated desired $TiO_xN_y$.

Referring to FIG. 3, a capacitor dielectric 26 has been formed over conductive $TiO_xN_y$ 22, and more preferably on conductive $TiO_xN_y$ 22 as shown. A conductive second capacitor electrode material 28 is formed over capacitor dielectric 26, and forms a capacitor 30. Such might be the same or different from materials 22 and/or 20, and regardless preferably in one implementation the conductive second capacitor electrode material comprises metal, and in one preferred implementation the depicted exemplary capacitor 30 which is formed comprises a metal-insulator-metal capacitor. In the context of this document, "metal" is any one or combination of one or more elemental metals, an alloy of elemental metals, or a conductive metal compound. One preferred conductive second capacitor electrode material comprises TiN, and whether second conductive capacitor electrode material 28 comprises, consists essentially of, or consists of TiN. A preferred exemplary thickness range for second capacitor electrode 28 is from 50 Angstroms to 300 Angstroms. Additional preferred second capacitor electrode materials include at least one of TaN, HfN, or NbN.

The formation of capacitor dielectric 26 might be in situ within a chamber within which the above-stated oxidizing occurs, or alternately be ex situ from a chamber in which the oxidizing occurs. Regardless, capacitor dielectric 26 might be homogenous, non-homogenous, or comprise a plurality of different dielectric materials and/or layers. One exemplary preferred capacitor dielectric is $HfO_2$, either alone or in combination with other materials. For example and by way of example only, an exemplary preferred dielectric is $HfO_2$ which is doped with at least one of Al, Zr, N, Si, or Y. One preferred material is $HfO_2$ which is doped with Al at an atomic ratio of Hf to Al from 3 to 20, with from 3 to 9 being more preferred. A preferred technique for forming capacitor dielectric 26 is by atomic layer deposition, for example utilizing tetrakisdimethylamido hafnium, $O_3$ or $H_2O$, and trimethyl aluminum as ALD deposition precursors. Further by way of example only, alternate exemplary preferred capacitor dielectric materials comprise any one or combination of aluminum oxide, tantalum oxide, zirconium oxide, niobium oxide, or silicon dioxide. Regardless, a preferred thickness range for capacitor dielectric 26 is from 50 Angstroms to 120 Angstroms, with from 50 Angstroms to 70 Angstroms being more preferred in present generation processing.

Referring to FIG. 4, an alternate exemplary method of forming a capacitor 31 is described with respect to an alternate embodiment substrate fragment 10a. Like numerals from the first-described embodiment are utilized where appropriate, with differences being indicated with the suffix "a" or with different numerals. FIG. 4 depicts a conductive inner capacitor electrode material 32 fabricated over exemplary substrate 12. In one preferred implementation, conductive inner capacitor electrode material 32 comprises metal. For example and by way of example only, inner capacitor electrode material 32 might comprise, consist essentially of, or consist of TiN. Further by way of example only, conductive inner capacitor electrode material 32 might comprise one or both of materials 20 and 22, as described above.

A capacitor dielectric 26 is formed over inner capacitor electrode material 32, and preferably on material 32 as shown. Exemplary preferred materials and thickness ranges for capacitor dielectric 26 and for inner capacitor electrode material 32 are as described above in connection with the first-described embodiment.

A conductive outer capacitor electrode 36 has been formed over capacitor dielectric 26, and preferably on capacitor dielectric 26 as shown. Conductive outer capacitor electrode material 36 comprises an inner conductive $TiO_xN_y$ 38 having a resistivity no greater than 1 ohm·cm where "x" is greater than 0 and "y" is from 0 to 1.4. Preferred attributes of such $TiO_xN_y$ 38 are as described above in the first-described embodiment in connection with $TiO_xN_y$ 22. Conductive outer capacitor electrode material 36 also preferably comprises a TiN-comprising material 40 received outwardly of $TiO_xN_y$ 38. In the depicted exemplary and preferred embodiment, inner conductive $TiO_xN_y$ 38 is formed on capacitor dielectric 26 and TiN-comprising material 40 is formed on $TiO_xN_y$ 38.

An aspect of the invention encompasses a method of forming a capacitor as just described in connection with FIG. 4 in any manner, and whether existing or yet-to-be developed. By way of example only, two exemplary preferred methodical implementations of fabricating the exemplary FIG. 4—depicted capacitor 31 are described. Referring first to FIG. 5, substrate fragment 10a is shown during processing to ultimately fabricate the exemplary depicted FIG. 4 capacitor 31. In FIG. 5, a first conductive TiN-comprising layer 42 has been deposited over capacitor dielectric 26, and more preferably on capacitor dielectric 26 as shown. Layer 42 might comprise, consist essentially of, or consist of TiN in but exemplary preferred implementations. An exemplary preferred thickness range for TiN-comprising layer 42 is from 5 Angstroms to 60 Angstroms.

Figure 6:
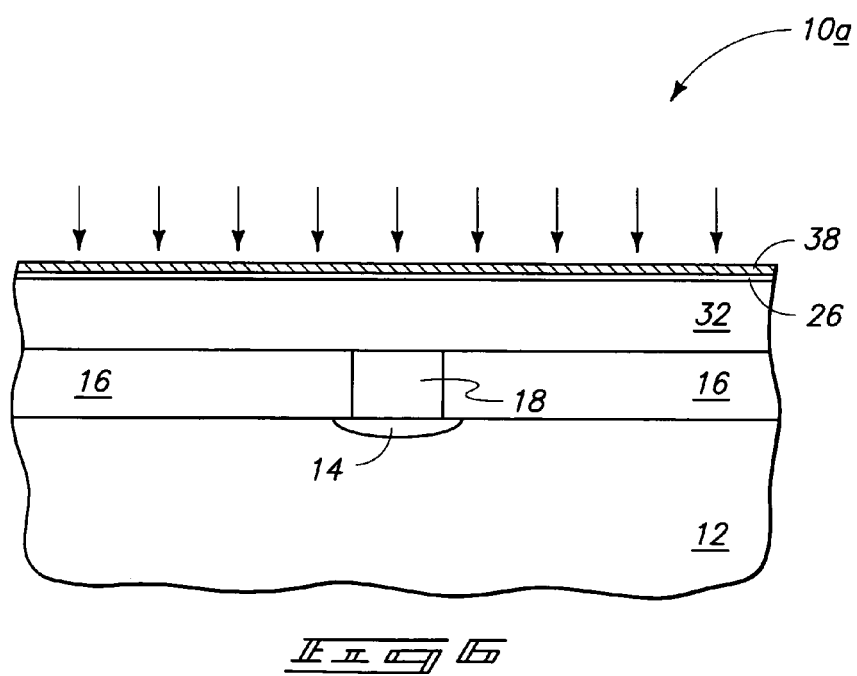
FIG. 6 is a view of the FIG. 5 fragment at a processing step subsequent to that shown by FIG. 5.

Referring to FIG. 6, TiN of first conductive TiN-comprising layer 42 has been oxidized to form conductive $TiO_xN_y$ 38 having a resistivity no greater than 1 ohm·cm where "x" is greater than 0 and "y" is from 0 to 1.4. Preferred manners of oxidizing are any of those described above in connection with the first-described embodiment. Subsequently, in one preferred embodiment, second conductive TiN-comprising layer 40 (FIG. 4) is deposited over conductive $TiO_xN_y$ 38.

Figure 7:
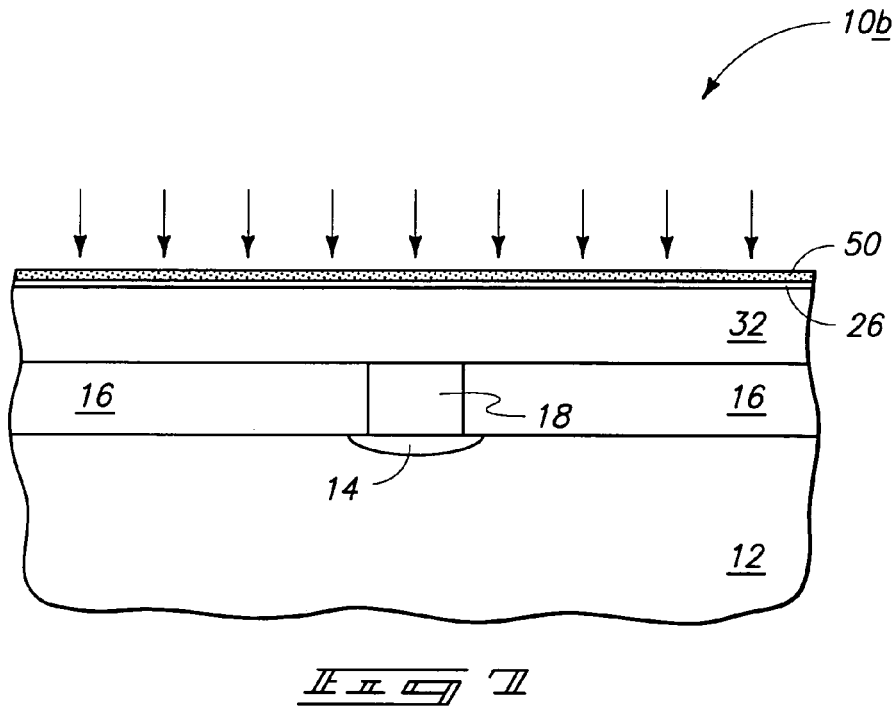
FIG. 7 is a diagrammatic cross sectional view of an alternate embodiment semiconductor substrate fragment in process in accordance with an aspect of the invention.

An alternate exemplary embodiment method of forming a capacitor to that of FIGS. 5 and 6 is described with reference to FIGS. 7 and 8 with respect to a substrate 10b. FIG. 7 depicts processing subsequent to that depicted by FIG. 5, and like numerals from the first and second described embodiments have been utilized where appropriate, with differences being indicated with the suffix "b" or with different numerals. In FIG. 7, first conductive TiN-comprising layer 42 of FIG. 5 has been oxidized to form an insulative $TiO_2$ layer 50. Any of the above-described oxidizing conditions might be utilized for a sufficient amount of time or degree to result in the complete oxidation of TiN of layer 42 to $TiO_2$, with nitrogen of layer 42 perhaps being driven off as $NO_x$ gas. Regardless, only some or all of the TiN of layer 42 might be oxidized to insulative $TiO_2$, with all of such being shown to have been so oxidized in FIG. 7.

Figure 8:
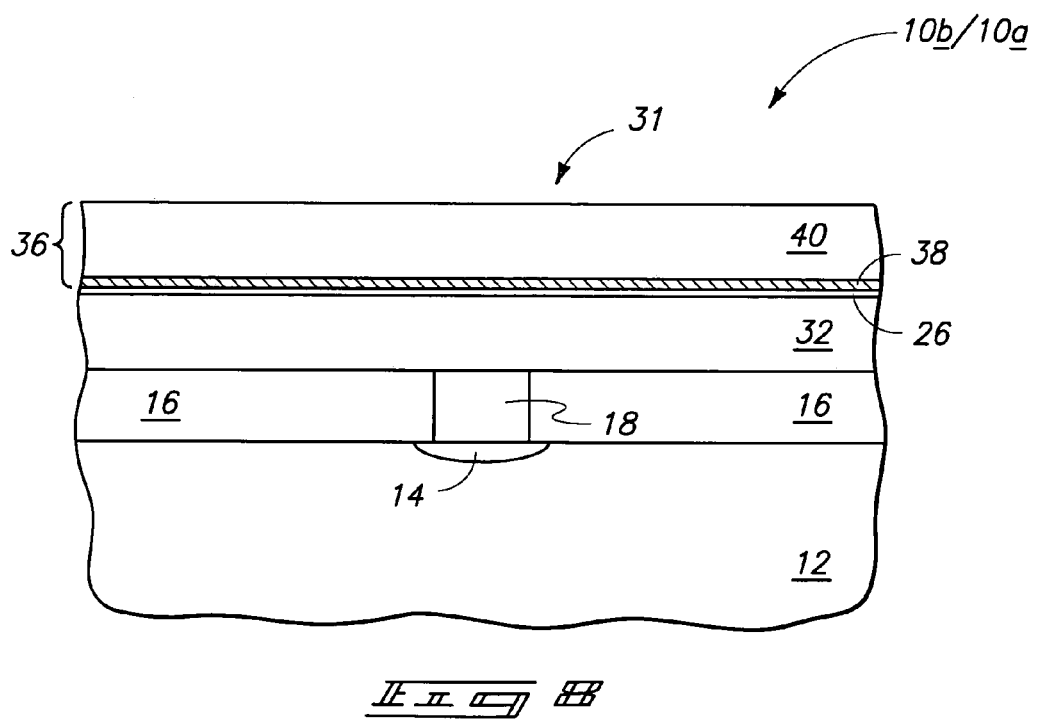
FIG. 8 is a view of the FIG. 7 fragment at a processing step subsequent to that shown by FIG. 7.

Referring to FIG. 8, conductive second TiN-comprising layer 40 has been deposited onto $TiO_2$ layer 50 of FIG. 7, and conductive $TiO_xN_y$ 38 is depicted as being formed in FIG. 8 from the interaction of TiN of second TiN-comprising layer 40 with the $TiO_2$ of layer 50, and again wherein $TiO_xN_y$ 38 has a resistivity no greater than 1 ohm·cm where "x" is greater than 0 and "y" is from 0 to 1.4. All or only some of the $TiO_2$ might form $TiO_xN_y$ by such interaction, with all of the $TiO_2$ in one preferred embodiment shown as being formed to $TiO_xN_y$ 38. The typical act of chemical vapor deposition of a TiN layer 40 onto layer 50 will typically, in situ during deposition, transform $TiO_2$ 50 to the $TiO_xN_y$ of the stated resistivity and composition as described above. For example and by way of example only, an exemplary CVD process for effecting the same includes using $TiCl_4$ and $NH_3$ as CVD precursors at an exemplary temperature range of from 400° C. to 700° C. and at an exemplary pressure of from 0.1 Torr to 10 Torr. Further and/or alternately, subsequent heat treatment for example at a temperature of at least 600° C. for a suitable period of time where TiN is in contact with $TiO_2$ layer 50 would be expected to form the desired $TiO_xN_y$. Regardless, in the depicted and in but one exemplary preferred embodiment, second conductive TiN-comprising layer 40 (FIG. 8) is deposited to a thickness that is greater than the thickness to which first conductive TiN-comprising layer 42 (FIG. 5) is deposited.

Figure 9:
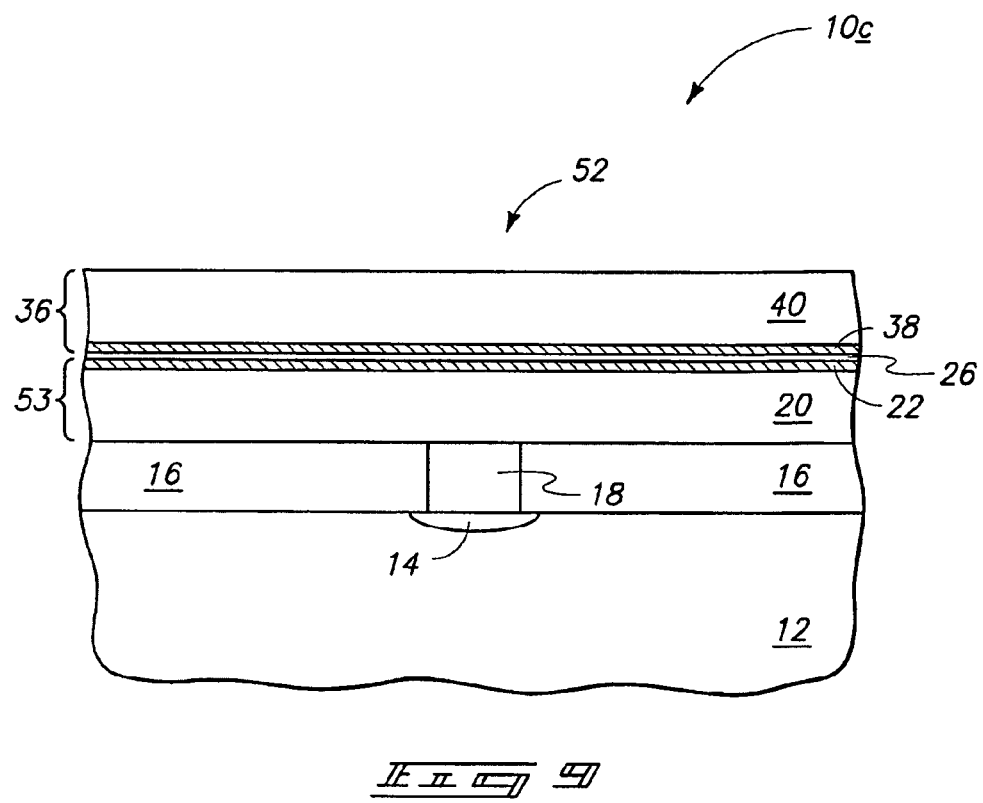
FIG. 9 is a diagrammatic cross sectional view of an alternate embodiment semiconductor substrate fragment in process in accordance with an aspect of the invention.

As alluded to above, various aspects of the invention might be combined in one or a combination of various attributes. For example and by way of example only, FIG. 9 depicts an exemplary alternate preferred embodiment substrate fragment 10c wherein an exemplary capacitor 52 has been formed. Like numerals from the above embodiments have been utilized where appropriate, with differences being indicated by the suffix "c" or with different numerals. An exemplary manner of forming the same includes forming a conductive first capacitor electrode material comprising TiN over a substrate, for example as described above in connection with FIG. 1. The TiN of TiN-comprising material 20 has been oxidized effective to form a first conductive $TiO_xN_y$ 22 having a resistivity no greater than 1 ohm·cm over TiN-comprising material 20 where, in the first conductive $TiO_xN_y$, "x" is greater than 0 and "y" is from 0 to 1.4. By way of example only, such results in the formation of conductive inner capacitor electrode material 53 essentially the same as is depicted and described above in connection with FIG. 2.

A capacitor dielectric 26 (FIG. 9) is formed over first conductive $TiO_xN_y$ 22, for example preferably as described above in connection with FIG. 3.

A conductive outer capacitor electrode material 36 is formed over capacitor dielectric 26, for example by any method as described above in connection with FIG. 4 and for example using any of the methods described above in connection with FIGS. 5-8.

The above describes preferred embodiment methods of forming capacitors. However, aspects of the invention also contemplate capacitors independent of the method of fabrication. For example, in one implementation, a capacitor comprises a conductive first capacitor electrode comprising a conductive TiN layer and a conductive $TiO_xN_y$ layer with the conductive $TiO_xN_y$ layer having a resistivity no greater than 1 ohm·cm and where "x" is greater 0 and "y" is from 0 to 1.4. Exemplary preferred constructions and attributes are as described above with respect to the first capacitor electrode encompassed by materials 20 and 22. A capacitor dielectric is received outwardly of the conductive first capacitor electrode, and wherein the conductive $TiO_xN_y$ layer is received between the conductive TiN layer and the capacitor dielectric. Preferred constructions and attributes of the capacitor dielectric are as described above in connection with dielectric 26. A conductive second capacitor electrode material is received outwardly of the capacitor dielectric. Any of the above preferred attributes with respect to a second capacitor electrode material in any of the above-described embodiments is contemplated.

Alternately, by way of example only, another implementation of a capacitor in accordance with the invention and independent of method contemplates a conductive first capacitor electrode. Any of the above constructions and implementations are contemplated, and regardless of whether TiN and/or $TiO_xN_y$ materials are utilized. A capacitor dielectric is received outwardly of the conductive first capacitor electrode. Exemplary and preferred materials and constructions are those as described above in connection with dielectric 26. A conductive second capacitor electrode is received outwardly of the capacitor dielectric. The conductive second capacitor electrode comprises a conductive TiN layer and a conductive $TiO_xN_y$ layer. The conductive $TiO_xN_y$ layer has a resistivity no greater than 1 ohm·cm, and where "x" is greater than 0 and "y" is from 0 to 1.4. The conductive $TiO_xN_y$ layer is received between the conductive TiN layer and the capacitor dielectric.

In one preferred implementation, a capacitor independent of the method of fabrication comprises a conductive first capacitor electrode comprising a conductive first TiN layer and a conductive second $TiO_xN_y$ layer. The conductive second $TiO_xN_y$ layer has a resistivity no greater than 1 ohm·cm, and where "x" is greater than 0 and "y" is from 0 to 1.4. A capacitor dielectric is received outwardly of the conductive first capacitor electrode. The second conductive $TiO_xN_y$ layer is received between the first conductive TiN layer and the capacitor dielectric. A conductive second capacitor electrode is received outwardly of the capacitor dielectric. The conductive second capacitor electrode comprises a conductive third TiN layer and a conductive fourth $TiO_xN_y$ layer. The conductive fourth $TiO_xN_y$ layer has a resistivity no greater than 1 ohm·cm, and where "x" is no greater than 0 and "y" is from 0 to 1.4. The conductive fourth $TiO_xN_y$ layer is received between the conductive third TiN layer and the capacitor dielectric. By way of example only, FIG. 9 is an exemplary depiction of such an exemplary capacitor.

Capacitors fabricated as above and regardless of method might exhibit an increased breakdown voltage and enhanced capacitance when employing one or more $TiO_xN_y$ layers, as described in any of the above implementations.

Figure 10:
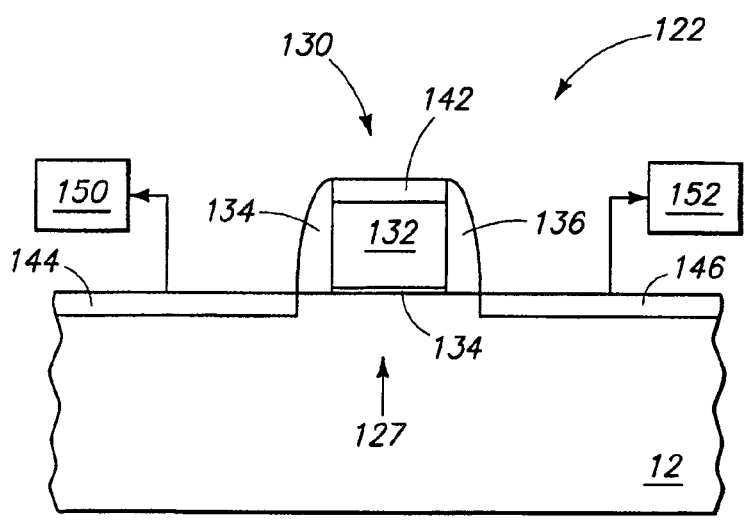
FIG. 10 is a view of an alternate embodiment substrate processing in accordance with aspects of the invention.

Capacitors as described above might be incorporated in integrated circuitry, including any circuit or sub-circuit and whether existing or yet to be developed. Further, by way of example only, such might comprise memory circuitry, for example DRAM circuitry. For example, FIG. 10 depicts a field effect transistor 130 incorporated into a DRAM memory cell 122. Specifically, field effect transistor 130 comprises a conductive gate region 132 received over a semiconductor substrate 12. Insulative sidewall spacers 134 and 136 are received over sidewalls of conductive gate region 132. An insulative cap 142 is received over the top of conductive gate region 132 between spacers 134 and 136.

Conductive gate region 132 is spaced from semiconductor material 12 by a suitable gate dielectric 134, thereby defining a channel region 127 within semiconductor material 12. Source/drain regions 144 and 146 are operably provided within semiconductor material 12 as shown. Alternate exemplary constructions for transistor 130 are of course contemplated, and whether existing or yet to be developed.

Exemplary source/drain region 144 is electrically connected to a storage device 150, and source/drain region 146 is electrically connected to a bitline 152. Storage device 150 can comprise any suitable device, including any capacitor as described above, for example. Bitline 152 can comprise any suitable construction. The field effect transistor and capacitor can be considered to be part of an integrated circuit, for example the DRAM integrated circuitry just described.

Figure 11:
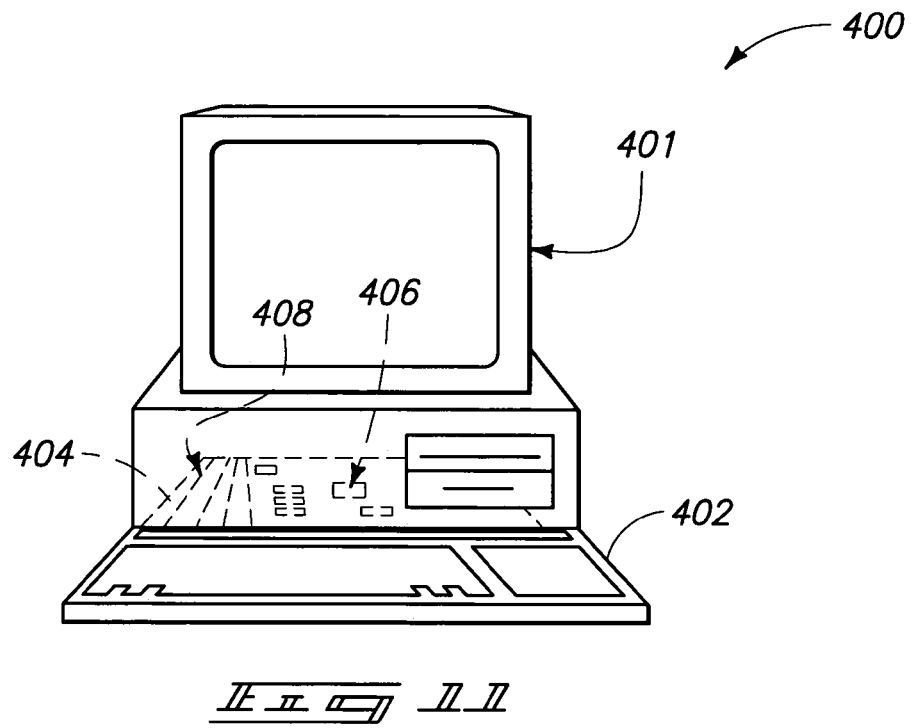
FIG. 11 is a diagrammatic view of a computer illustrating an exemplary application of the present invention.
Figure 12:
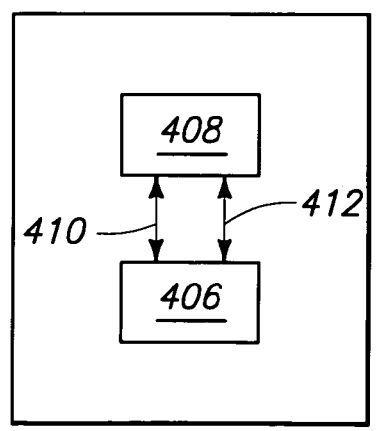
FIG. 12 is a block diagram showing particular features of the motherboard of the FIG. 15 computer.

FIG. 11 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, one or more of the wordlines, bitlines and DRAM unit cells. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 12. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation which utilizes the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices, by way of example only, include SDRAM, DDR SDRAM, SLDRAM, VRAM and Direct RDRAM, as well as others such as SRAM or Flash memories.

FIG. 13 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by processor 702 and other interactions between processor 702, memory device unit 706 and I/O devices 708. Control unit 704 coordinates all operations of processor 702, memory device 706 and I/O devices 708 by continuously cycling through a set of operations that cause instructions to be fetched from memory device 706 and executed. In various embodiments, memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells, wordlines and bitlines in accordance with various aspects of the present invention.

FIG. 14 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. Memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. System 800 also includes a processor 822, or memory controller for memory accessing.

Memory device 802 receives control signals 824 from processor 822 over wiring or metallization lines. Memory device 802 is used to store data which is accessed via I/O lines. It will be appreciated by those skilled in the art that additional circuitry and control signals can be provided, and that memory device 802 has been simplified to help focus on the invention. At least one of processor 822 or memory device 802 can include a DRAM cell of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of ordinary skill in the art will understand that the various electronic systems can be fabricated in single-package processing units, or even on a single semiconductor chip, in order to reduce the communication time between the processor and the memory device(s).

Applications for memory cells, wordlines and bitlines can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a capacitor, comprising:
   forming a conductive first capacitor electrode material comprising TiN over a substrate;
   oxidizing TiN of the TiN-comprising material effective to form conductive $TiO_xN_y$ having resistivity no greater than 1 ohm·cm over the TiN-comprising material, where x is greater than 0 and y is from 0 to 1.4;
   forming a capacitor dielectric over the conductive $TiO_xN_y$, the oxidizing comprising wet oxidizing including exposure to an $H_2O_2$-comprising solution; and
   forming a conductive second capacitor electrode material over the capacitor dielectric.

2. The method of claim 1 wherein resistivity of the $TiO_xN_y$ is no greater than 0.5 ohm·cm.

3. The method of claim 1 wherein x is no greater than 1.98.

4. The method of claim 3 wherein y is zero.

5. The method of claim 1 wherein y is greater than zero.

6. The method of claim 1 wherein x is no greater than 1.98, and y is greater than zero and no greater than 1.3.

7. The method of claim 1 wherein the capacitor dielectric is formed on the conductive $TiO_xN_y$.

8. The method of claim 1 wherein the $TiO_xN_y$ is formed to a thickness of from 5 Angstroms to 60 Angstroms.

9. The method of claim 8 wherein the $TiO_xN_y$ is formed to a thickness of from 15 Angstroms to 30 Angstroms.

10. The method of claim 1 wherein the conductive $TiO_xN_y$ is formed on TiN of the TiN-comprising layer.

11. The method of claim 10 wherein the $TiO_xN_y$ is formed to a thickness of from 5 Angstroms to 60 Angstroms.

12. The method of claim 10 wherein the capacitor dielectric comprises $HfO_2$.

13. The method of claim 1 wherein the conductive $TiO_xN_y$ is formed on TiN of the TiN-comprising layer, and the capacitor dielectric is formed on the conductive $TiO_xN_y$.

14. The method of claim 1 wherein the oxidizing comprises exposure to $O_3$.

15. The method of claim 1 wherein the oxidizing also comprises dry oxidizing.

16. The method of claim 15 wherein the oxidizing comprises exposure to at least one of NO, $N_2O$ or $NO_2$.

17. The method of claim 15 wherein the oxidizing occurs within a chamber, the capacitor dielectric being formed in situ within the chamber within which the oxidizing occurs.

18. The method of claim 15 wherein the oxidizing occurs within a chamber, the capacitor dielectric being formed ex situ from the chamber within which the oxidizing occurs.

19. The method of claim 1 wherein the oxidizing comprises exposure to plasma.

20. The method of claim 19 wherein the oxidizing occurs within a chamber, the plasma being formed remote from the chamber.

21. The method of claim 19 wherein the oxidizing occurs within a chamber, the plasma being formed within the chamber.

22. The method of claim 1 wherein the capacitor dielectric comprises $HfO_2$.

23. The method of claim 1 wherein the capacitor dielectric comprises at least one of aluminum oxide, tantalum oxide, niobium oxide, or zirconium oxide.

24. The method of claim 1 wherein the conductive first capacitor electrode material consists essentially of TiN.

25. The method of claim 1 wherein the first capacitor electrode also comprises at least one of TaN, HfN, or NbN.

26. The method of claim 1 wherein the conductive second capacitor electrode material comprises metal.

27. The method of claim 26 wherein the conductive second capacitor electrode material comprises TiN.

28. The method of claim 26 wherein the conductive second capacitor electrode comprises at least one of TaN, HfN, or NbN.

29. The method of claim 1 wherein the conductive second capacitor electrode material comprises conductive $TiO_xN_y$ having resistivity no greater than 1 ohm·cm where in the conductive second capacitor electrode material x is greater than 0 and y is from 0 to 1.4.

30. The method of claim 1 wherein the capacitor dielectric comprises $HfO_2$, the conductive first capacitor electrode material consists essentially of TiN, and the conductive second capacitor electrode material comprises conductive $TiO_xN_y$ having resistivity no greater than 1 ohm·cm where in the conductive second capacitor electrode material x is greater than 0 and y is from 0 to 1.4, and the conductive second capacitor electrode material comprises TiN.

31. A method of forming a capacitor, comprising:
   forming a conductive first capacitor electrode material comprising TiN over a substrate;
   oxidizing TiN of the TiN-comprising material effective to form conductive $TiO_xN_y$ having resistivity no greater than 1 ohm·cm over the TiN-comprising material, where x is greater than 0 and y is from 0 to 1.4;
   forming a capacitor dielectric over the conductive $TiO_xN_y$, the capacitor dielectric comprising $HfO_2$ which is doped with at least one of Al, Zr, N, Si, or Y; and
   forming a conductive second capacitor electrode material over the capacitor dielectric.

32. The method of claim 31 wherein the oxidizing is wet.

33. The method of claim 32 wherein the oxidizing comprises exposure to $O_3$.

34. The method of claim 32 wherein the oxidizing comprises exposure to an $H_2O_2$-comprising solution.

35. The method of claim 31 wherein the $HfO_2$ is doped with Al, atomic ratio of Hf to Al in the doped $HfO_2$ being from 3 to 20.

36. The method of claim 35 wherein atomic ratio of Hf to Al in the doped $HfO_2$ is from 3 to 9.

37. The method of claim 31 wherein the $HfO_2$ is doped with Al.

38. The method of claim 31 wherein the $HfO_2$ is doped with Zr.

39. The method of claim 31 wherein the $HfO_2$ is doped with N.

40. The method of claim 31 wherein the $HfO_2$ is doped with Si.

41. The method of claim 31 wherein the $HfO_2$ is doped with Y.

42. A method of forming a capacitor, comprising:
   forming a conductive first capacitor electrode material comprising TiN over a substrate;
   oxidizing TiN of the TiN-comprising material effective to form conductive $TiO_xN_y$ having resistivity no greater than 1 ohm·cm over the TiN-comprising material, where x is greater than 0 and y is from 0 to 1.4;
   forming a capacitor dielectric comprising $HfO_2$ over the conductive $TiO_xN_y$; and
   forming a conductive second capacitor electrode material over the capacitor dielectric.

43. A method of forming a capacitor, comprising:
   forming a conductive first capacitor electrode material comprising TiN over a substrate;
   oxidizing TiN of the TiN-comprising material effective to form conductive $TiO_xN_y$ having resistivity no greater than 1 ohm·cm over the TiN-comprising material, where x is greater than 0 and y is from 0 to 1.4, the oxidizing comprising a combination of wet and dry oxidizing;
   forming a capacitor dielectric over the conductive $TiO_xN_y$; and
   forming a conductive second capacitor electrode material over the capacitor dielectric.

* * * * *

UNITED STATES PATENT AND TRADEMARK OFFICE
CERTIFICATE OF CORRECTION

| | |
|---|---|
| PATENT NO. | : 7,635,623 B2 |
| APPLICATION NO. | : 11/488587 |
| DATED | : December 22, 2009 |
| INVENTOR(S) | : Bhat et al. |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 514 days.

Signed and Sealed this

Twenty-first Day of December, 2010

David J. Kappos
*Director of the United States Patent and Trademark Office*